(12) United States Patent
Hayashi et al.

(10) Patent No.: US 8,575,499 B2
(45) Date of Patent: Nov. 5, 2013

(54) SEAL STRUCTURE

(75) Inventors: Takahiro Hayashi, Fujisawa (JP); Keiichi Miyajima, Fujisawa (JP)

(73) Assignee: Nippon Mektron, Ltd. (JP)

( * ) Notice: Subject to any disclaimer, the term of this patent is extended or adjusted under 35 U.S.C. 154(b) by 284 days.

(21) Appl. No.: 13/120,882

(22) PCT Filed: Apr. 26, 2010

(86) PCT No.: PCT/JP2010/057342
§ 371 (c)(1), (2), (4) Date: Mar. 24, 2011

(87) PCT Pub. No.: WO2010/150591
PCT Pub. Date: Dec. 29, 2010

(65) Prior Publication Data
US 2011/0181003 A1 Jul. 28, 2011

(30) Foreign Application Priority Data
Jun. 25, 2009 (JP) .................................. 2009-150409

(51) Int. Cl.
*H01L 23/02* (2006.01)
*F16J 15/00* (2006.01)

(52) U.S. Cl.
USPC ........... 174/564; 174/539; 277/630; 277/626; 277/627

(58) Field of Classification Search
USPC ...... 174/377, 17 R, 520, 50, 17 CT, 539, 564, 174/72 A, 77 R, 152 R, 153 R, 152 G, 135, 174/153 G; 277/626, 630, 602, 627, 314, 277/617, 625; 439/604; 16/2.1, 2.2
See application file for complete search history.

(56) References Cited

U.S. PATENT DOCUMENTS

| | | | | |
|---|---|---|---|---|
| 5,491,300 | A | * | 2/1996 | Huppenthal et al. .......... 174/564 |
| 6,064,003 | A | * | 5/2000 | Moore et al. .................. 439/604 |
| 8,178,794 | B2 | * | 5/2012 | Hayashi et al. ............... 174/564 |
| 2002/0079653 | A1 | | 6/2002 | Noguchi et al. |
| 2006/0032653 | A1 | * | 2/2006 | Minoshima et al. ......... 174/52.3 |
| 2009/0250261 | A1 | * | 10/2009 | Hayashi et al. ............... 174/377 |
| 2010/0181089 | A1 | * | 7/2010 | Hayashi et al. .............. 174/50.5 |
| 2011/0031703 | A1 | * | 2/2011 | Hayashi ........................ 277/626 |

FOREIGN PATENT DOCUMENTS

| | | |
|---|---|---|
| JP | S63-74032 U | 5/1988 |
| JP | 2002-198664 A | 7/2002 |
| JP | 2003-142836 A | 5/2003 |
| JP | 2004-214927 A | 7/2004 |
| JP | 2008-135705 A | 6/2008 |

* cited by examiner

*Primary Examiner* — Angel R Estrada
(74) *Attorney, Agent, or Firm* — Harness, Dickey & Pierce, P.L.C.

(57) ABSTRACT

To provide a seal structure having seal members which can be easily inserted into insertion holes of a housing, and achieve an excellent sealing performance of the seal members, the seal structure is comprised of a housing provided with insertion holes to which a flexible wiring substrate is inserted, and seal members which are integrally formed on the flexible wiring substrate are made of a rubber elastic material in a bush-shape, and hermetically seal gaps between the insertion holes and the flexible wiring substrate, wherein projected portions are provided on parts of the flexible wiring substrate at positions where the seal members are integrally formed.

13 Claims, 6 Drawing Sheets

SEAL STRUCTURE

CROSS-REFERENCE TO RELATED APPLICATIONS

This is a national stage of International Application No. PCT/JP2010/057342 filed on Apr. 26, 2010 and published in the Japanese language. This application claims the benefit of Japanese Application No. 2009-150409, filed Jun. 25, 2009. The disclosures of the above applications are incorporated herein by reference.

BACKGROUND OF THE INVENTION

1. Field of the Invention

The present invention relates to a seal structure.

More particularly, the present invention relates to a seal structure providing a waterproof structure of an electronic device and a connector.

2. Description of the Conventional Art

Recently, as for a waterproof connector which is used in an electronic device such as a cellular phone or the like, an automotive wire harness and the like, a high waterproof function is demanded while downsizing is promoted.

In order to provide a waterproof function to the electronic device comprising a plurality of spaces, it is necessary to provide an airtightness to a housing constructing each of the spaces, and electrically connect between the spaces by a flexible substrate or the like.

In this case, there have been proposed a method of arranging terminals on wall surfaces of the housing comparting it into the spaces, and connecting the terminals by a wiring member, and a method of inserting the wiring member through the wall surface of the housing and filling a gap between the wiring member and the housing with an adhesive agent or the like.

However, the mode that the terminals are provided on the housing wall surface has such a problem that an equipment is enlarged in size.

The method of filling the gap between the wiring member and the housing with the adhesive agent or the like causes such a problem that disassembly and reassembly are difficult.

Consequently, there has been proposed a mode that seal members are integrally formed on a flexible wiring substrate, as shown in FIG. 8 (Japanese Unexamined Patent Publication Nos. 2004-214927 and 2003-142836).

The mode shown in FIGS. 8 to 10 is structured such that bush-shaped seal members 300 are integrally formed with a flexible wiring substrate 100.

The seal members 300 are installed to insertion holes 210 provided in a housing 200, as shown in FIG. 10.

Further, connectors 120 provided on both ends of the flexible wiring substrate 100 are electrically connected to electric parts within the housing 200.

In this case, shapes of the seal members 300, and shapes and sizes of the insertion holes 210 provided in the housing 200 for the flexible wiring substrate 100 to passing through are determined by shapes of the connectors 120 (the terminals) arranged on ends of the flexible wiring substrate 100.

This is because of necessity to insert the connectors 120 into the housing 200 via the insertion holes 210 of the housing 200.

Particularly, under such a background that transmission of a lot of information is indispensable due to a recent technical innovation, provision of a lot of pins become significantly necessary and the like, the connectors 120 provided on end portions of the flexible wiring substrate 100 are enlarged in size.

As a result, as shown in FIG. 9, a width Z of the seal member 300 is inevitably enlarged to a great extent in comparison with a width Y of the flexible wiring substrate 100.

Accordingly, the following problems are caused.

As shown in FIG. 10, since both sides (both ends in a direction along long sides) of the seal member 300, at which the flexible wiring substrate 100 does not exist, do not enter into the insertion hole 210, and deform largely downward in the figure, at a time of inserting the seal member 300 to the insertion hole 210 of the housing 200 in a direction of an arrow, such a problem that it is hard to insert is brought about.

Further, in the case of being compressed by force so as to be inserted, the seal member 300 is inserted while being deformed, and there is a risk that a waterproofing performance is lowered.

SUMMARY OF THE INVENTION

Problem to be Solved by the Invention

The present invention is made by taking the points mentioned above into consideration, and an object of the present invention is to provide a seal structure for which an operation for inserting a seal member to an insertion hole of a housing can be easily carried out, and a good sealing performance of the seal member can be achieved.

Means for Solving the Problem

In order to achieve the object mentioned above, in accordance with the present invention, there is provided a seal structure comprising:

a housing which is provided with insertion holes to which a flexible wiring substrate is inserted; and bush-shaped rubber elastic material-made seal members which are integrally formed on the flexible wiring substrate, and seal gaps between the insertion holes and the flexible wiring substrate, wherein projected portions are provided on a parts of the flexible wiring substrate at positions at which the seal members are integrally formed.

Effect of the Invention

The present invention achieves effects described below.

In accordance with the seal structure of the invention according to a first aspect, it is easy to carry out an operation for inserting the seal members to the insertion holes of the housing, and it is possible to achieve a good sealing performance of the seal member.

Further, in accordance with the seal structure of the invention according to a second aspect, it is possible to suppress deformation at a time of insertion of the both end portions in the direction along the long sides of the seal member, where the sectional shape of the seal member is rectangular.

Further, in accordance with the seal structure of the invention according to a third aspect, it is possible to securely suppress deformation at a time of insertion of the both end portions in the width-wise direction, where the sectional shape of the seal member is rectangular, and since surface pressure generated to the seal member becomes uniform all over the surface to thereby make a sealing property good, it is possible to enhance a waterproofing performance.

Further, in accordance with the seal structure of the invention according to a fourth aspect, it is possible to make mechanical strength of the projected portions to such a level as is sufficiently durable against insertion resistance.

Further, in accordance with the seal structure of the invention according to a fifth aspect, it is possible to suppress a problem that detachment is caused between the seal member and the flexible substrate.

Further, in accordance with the seal structure of the according to a sixth aspect, such is suitable for a seal structure having a symmetrical shape.

Further, in accordance with the seal structure of the invention according to a seventh aspect, such is suitable for a seal structure having an asymmetrical shape.

Further, in accordance with the seal structure of the invention according to an eighth aspect, such is suitable for a seal structure in which a copper paste is applied to make a printed wiring layer.

Further, in accordance with the seal structure of the invention according to a ninth aspect, such is suitable for a seal structure in which a copper foil is etched to make a printed wiring layer.

Further, in accordance with the seal structure of the invention according to a tenth aspect, such is suitable for a seal structure in which connectors are attached to end portions of the flexible wiring substrate.

Further, in accordance with the seal structure of the invention according to an eleventh aspect, such is suitable for a seal structure in which connectors having larger widths than a width of the flexible wiring substrate are attached to the end portions of the flexible wiring substrate.

Further, in accordance with the seal structure of the invention according to a twelfth aspect, such is suitable for a seal structure in which the seal members are constructed by a combination of bush shaped members.

Further, in accordance with the seal structure of the invention according to a thirteenth aspect, such is suitable for a seal structure in which the seal members are constructed by a combination of a bush shaped member and a frame shaped member.

DETAILED DESCRIPTION OF PREFERRED EMBODIMENT

A description will be given below of an embodiment for carrying out the present invention.

A description will be given of a most preferred embodiment for carrying out the invention on the basis of FIGS. 1 to 7.

Figure 1:
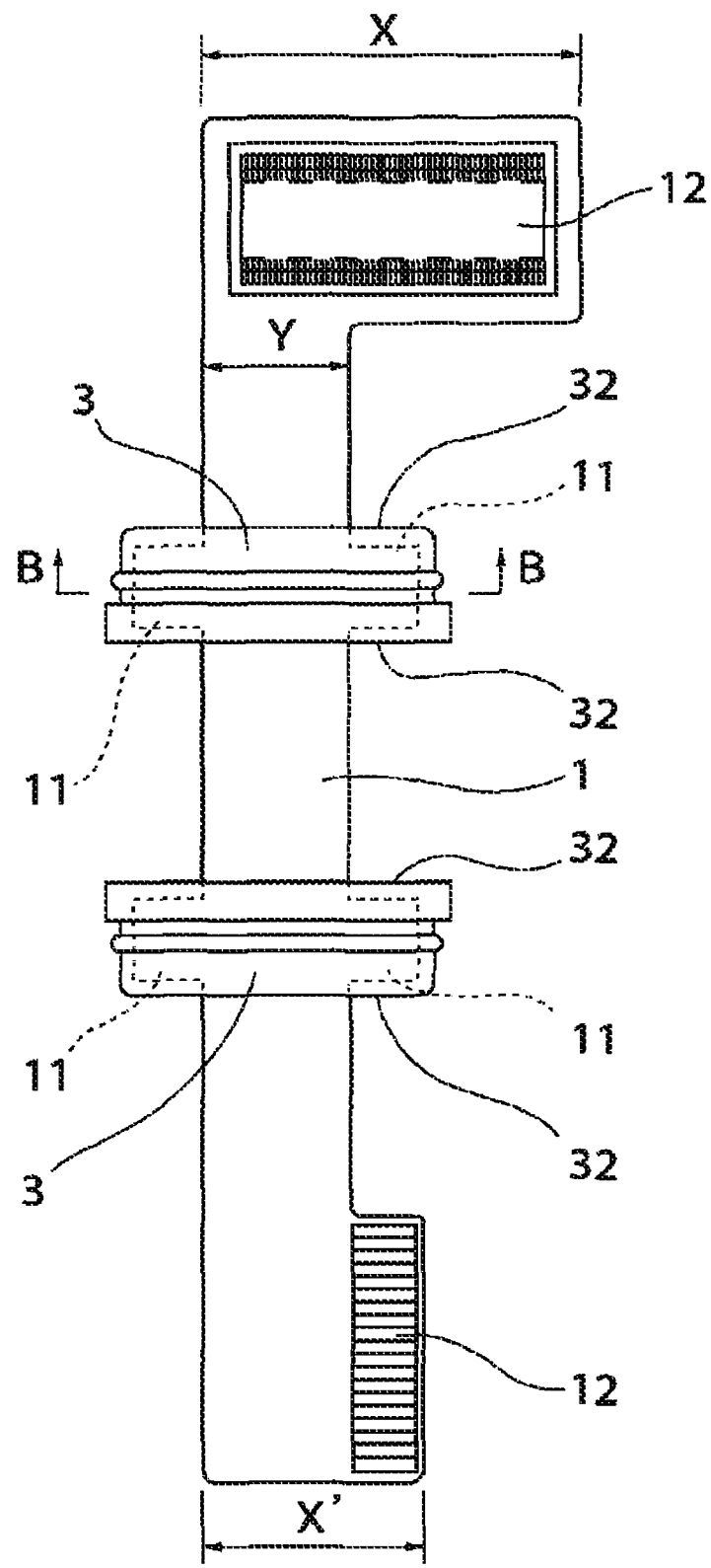
FIG. 1 is a plan view before a seal structure to which the present invention is applied is installed to a housing.
Figure 2:
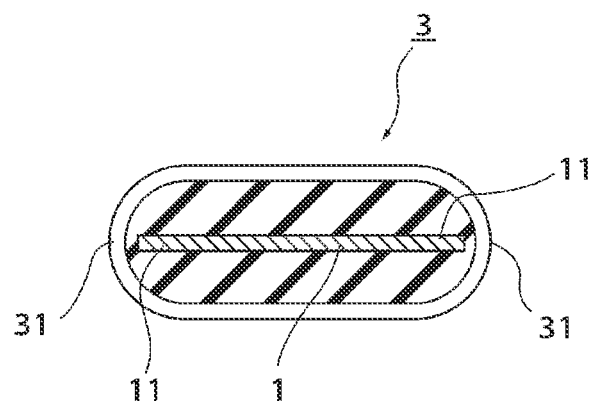
FIG. 2 is a sectional view along a line B-B in FIG. 1.
Figure 3:
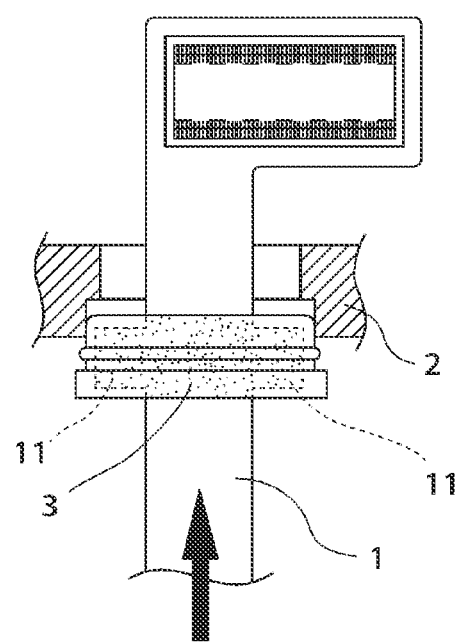
FIG. 3 is a view showing a state in which the seal structure in FIG. 1 is inserted to an insertion hole of the housing.

A seal structure in accordance with the present invention is basically structured, as shown in FIGS. 1, 2 and 3, such as to have a housing 2 which is provided with insertion holes 21 to which a flexible wiring substrate 1 is inserted, and bush-shaped rubber elastic material-made seal members 3 which are integrally formed on the flexible wiring substrate 1 and seal gaps between the insertion holes 21 and the flexible wiring substrate 1, and to be provided with projected portions 11 on parts of the flexible wiring substrate 1, at positions at which the seal members 3 are integrally formed.

Further, a sectional shape of the seal member 3 is formed approximately in a rectangular shape because of being provided on the sheet-shaped flexible wiring substrate 1.

In this case, as shown in FIG. 2, both end portions 31 and 31 in a direction along long sides of the seal member 3 are formed in a circular arc shape in the light of a sealing property and an installing property.

Further, the projected portions 11 are structured such as to exist so as to extend up to the vicinities of both end portions 31 and 31 in the direction along the long sides of the seal member 3.

Further, the projected portions 11 exist so as to extend up to the vicinities of both end portions 32 and 32 in an axial direction of the seal member 3, as shown by phantom lines in FIGS. 1 and 3.

As a result, the projected portions 11 exists over approximately the whole in the direction along the long sides and the axial direction of the seal member 3, and the whole of the projected portions 11 is structured such as to be buried in the seal member 3.

Accordingly, it is possible to make mechanism strength of the projected portions 11 to such a level as is sufficiently durable against insertion resistance, and it is possible to avoid a problem that detachment is caused between the seal member 3 and the flexible substrate 1.

Figure 4A:
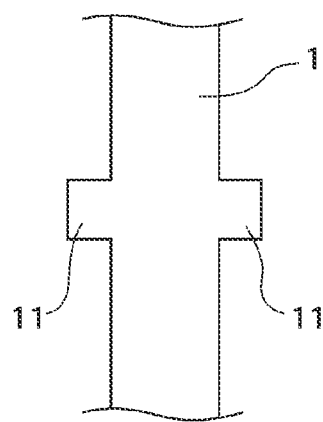
FIG. 4A is a view showing an aspect in which projected portions are provided on both sides of a flexible wiring substrate.
Figure 4B:
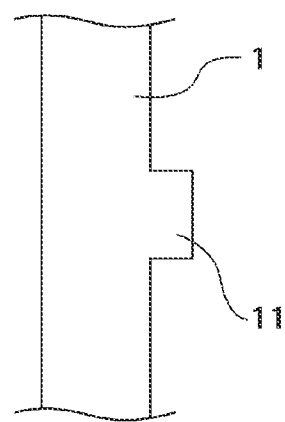
FIG. 4B is a view showing an aspect in which the projected portion is provided on one side of the flexible wiring substrate.

Further, the projected portions 11 may be structured, as shown in FIG. 4A, such as to be provided on both sides of the flexible wiring substrate 1, or may be structured, as shown in FIG. 4B, such as to be provided only on one side of the flexible wiring substrate 1.

Generally, the flexible wiring substrate 1 is provided with the following structure.

A silver paste is applied on one surface of a base substrate 13 made of an elastic material such as a polyimide, a polyamide, a polyester, a liquid crystal polymer or the like, or a printed wiring layer 14 made by a copper foil 141 being etched is adhered fixedly thereto.

Next, an insulation layer for protecting a surface is formed on a surface of the printed wiring layer 1.

The insulation layer is called as a top coat and an alkyd resin is used for it.

Figure 5A:
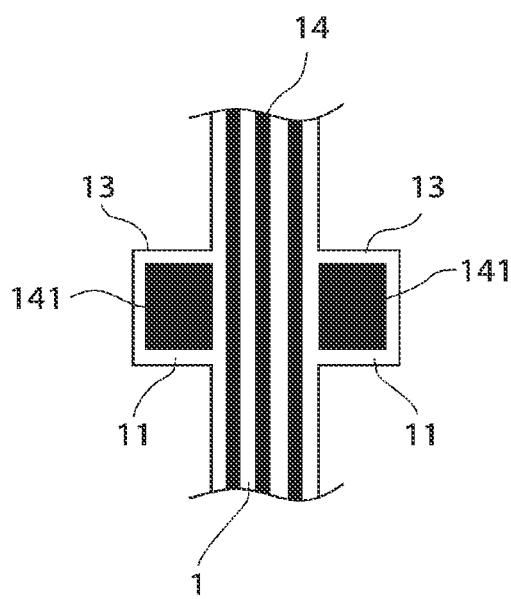
FIG. 5A is a view showing an aspect in which the projected portions are formed by a base substrate and a copper foil layer constructing the flexible wiring substrate.

Accordingly, as shown in FIG. 5A, in the case that the printed wiring layer 14 is formed by etching the copper foil 141, the projected portions 11 are formed by the base substrate 13, and the copper foil layer 141 forming the printed wiring layer 14, or is constructed by layers including an insulating layer in addition thereto.

Figure 5B:
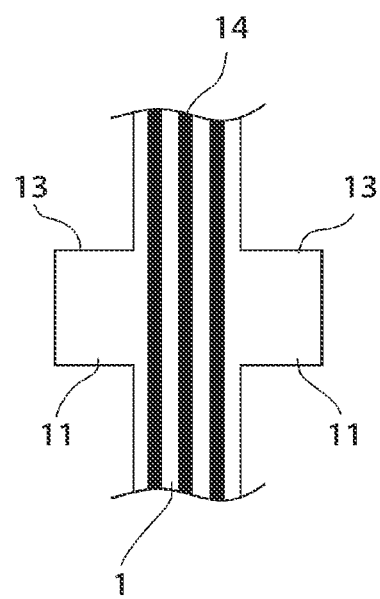
FIG. 5B is a view showing an aspect in which the projected portions are formed by the base substrate constructing the flexible wiring substrate.

Further, as shown in FIG. 5B, in the case that the printed wiring layer 14 is formed by applying a silver paste, the projected portions 11 are formed by the base substrate 13, or is constructed by layers including an insulating layer in addition thereto.

Further, as shown in FIG. 1, connectors 12 are attached to end portions of the flexible wiring substrate 1.

Further, widths X and X' of portions provided with the connectors 12 are structured such as to be larger than a width Y of the flexible wiring substrate 1.

Figure 6A:
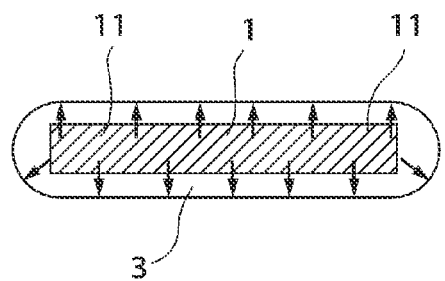
FIG. 6A is a view showing a state of seal surface pressure of the seal structure in accordance with the present invention.
Figure 6B:
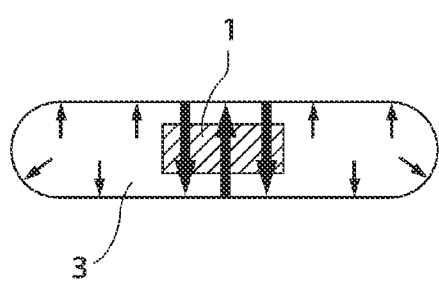
FIG. 6B is a view showing a state of seal surface pressure of a seal structure in accordance with a conventional art.

Accordingly, in the case that the projected portions 11 are not provided (in the case of the conventional art), ranges in which the flexible wiring substrate 1 does not exist inevitably exist extensively in both sides of the seal member 3, as shown in FIG. 6B.

As a result, as shown by arrows in FIG. 6B, since surface pressure at the position in which the flexible wiring substrate 1 exists becomes high, and surface pressure at the positions in which the flexible wiring substrate 1 does not exist becomes low, on the seal member 3, seal surface pressure on the whole of the seal member 3 comes to an uneven state.

On the other hand, in the case that the projected portions 11 are provided, a similar state to a state in the case that the flexible wiring substrate 1 exists in the whole of the seal member 3 is formed, as shown in FIG. 6A. Accordingly, it is possible to keep seal surface pressure of the whole of the seal member 3 uniform, as shown by arrows in FIG. 6A.

Figure 7:
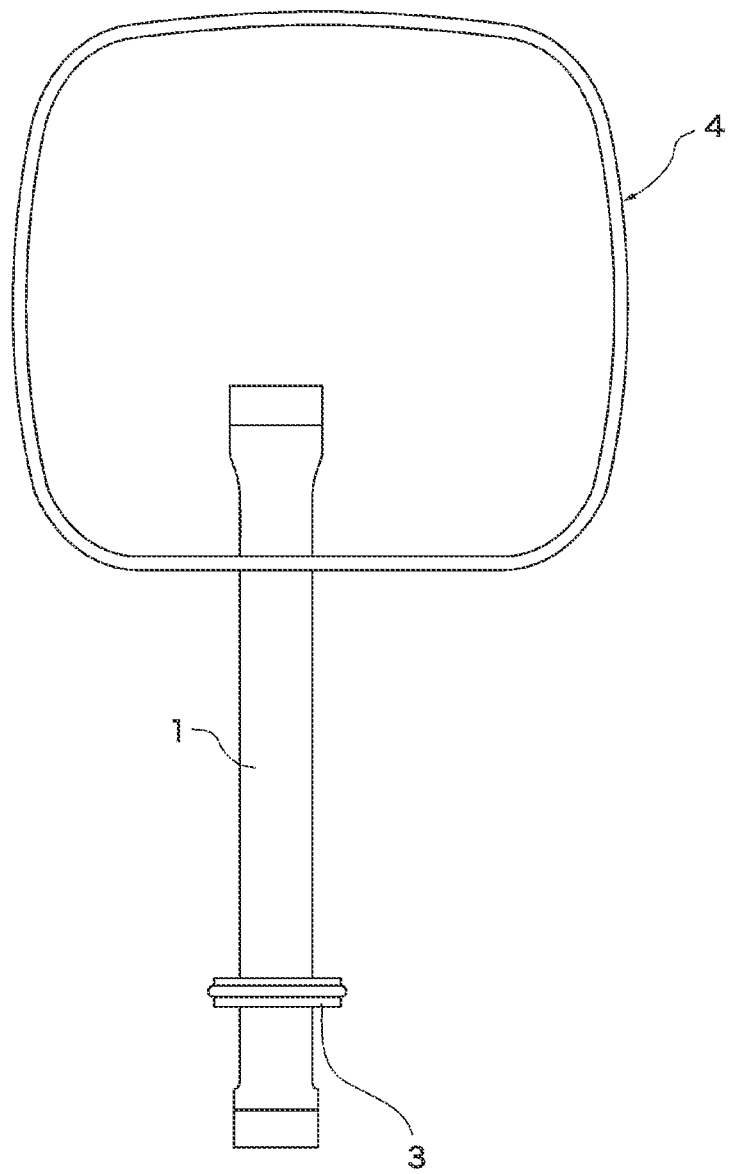
FIG. 7 is a view showing a seal structure in which seal members are constructed by a combination of a bush shaped member and a frame shaped member, in accordance with another embodiment of the present invention.
Figure 8:
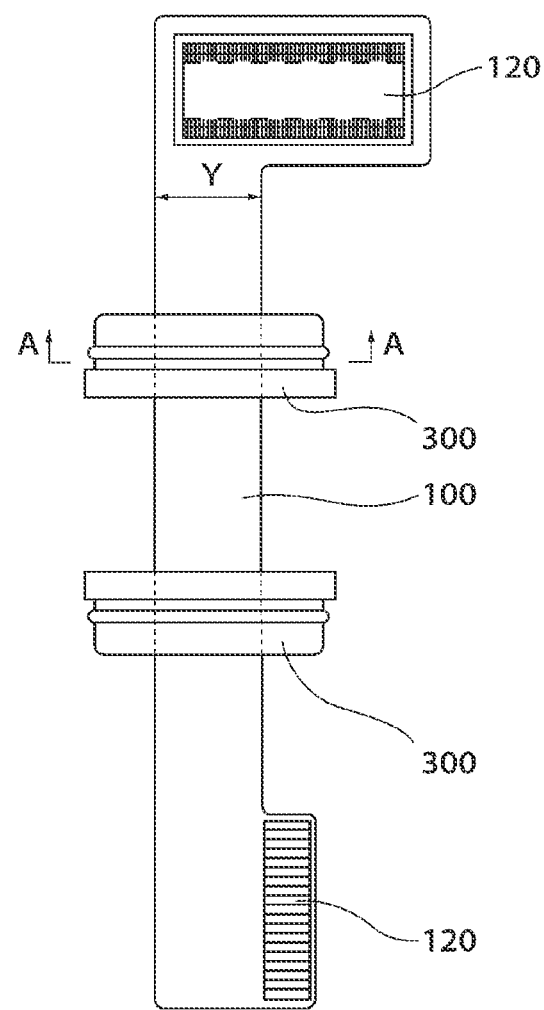
FIG. 8 is a plan view before a seal structure in accordance with the conventional art is installed to a housing.
Figure 9:
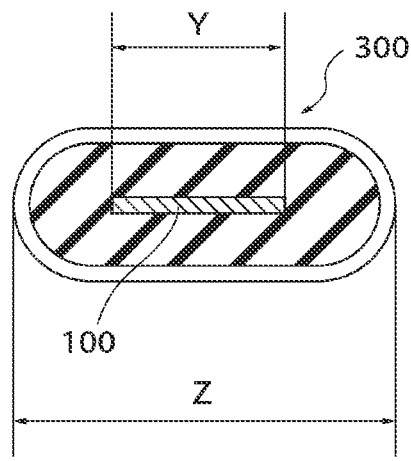
FIG. 9 is a sectional view along a line A-A in FIG. 8.
Figure 10:
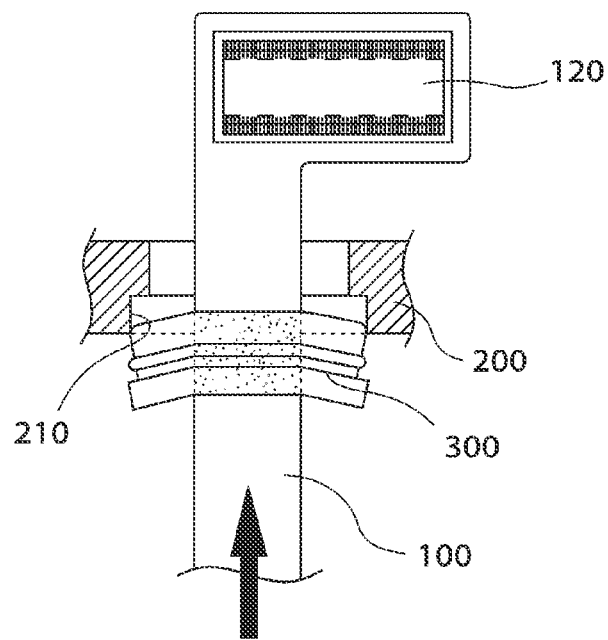
FIG. 10 is a view showing a state in which the seal structure in FIG. 8 is inserted to an insertion hole of the housing.

Further, needless to say, the seal member 3 can be applied to a combination of bush shaped members as shown in FIG. 1, however, it can be also applied to a combination of the bush-shaped seal member 3 and a frame-shaped seal member 4, as shown in FIG. 7.

As a matter of course, the present invention is applied only to the bush-shaped seal member 3 for which the insertion hole is provided in the housing.

A material of the seal member 3 can be various rubber elastic materials such as an urethane rubber, silicone rubber, a fluorine-contained rubber, a natural rubber and the like, however, a self-adhesive liquid rubber is preferable in the light of adhesiveness and a molding property.

Further, needless to say, the present invention is not limited to the preferred embodiment for carrying out the invention as mentioned above, but can employ the other various structures without deviating from the scope of the present invention.

What is claimed is:

1. A seal structure comprising:
    a housing which is provided with insertion holes to which a flexible wiring substrate is inserted; and
    bush-shaped rubber elastic material-made seal members which are integrally formed on said flexible wiring substrate, and seal gaps between said insertion holes and said flexible wiring substrate,
    wherein projected portions expanding a width of said flexible wiring substrate are provided on parts of the flexible wiring substrate at positions at which said seal members are integrally formed.

2. The seal structure as claimed in claim 1, wherein a sectional shape of said seal members is approximately rectangular.

3. The seal structure as claimed in claim 1, wherein said projected portions exist to extend up to the vicinities of both end portions in a width-wise direction of said seal members.

4. The seal structure as claimed in claim 1, wherein said projected portions exist to extend up to the vicinities of both end portions in an axial direction of said seal members.

5. The seal structure as claimed in claim 1, wherein the whole of said projected portions is buried in said seal members.

6. The seal structure as claimed in claim 1, wherein said projected portions are provided on both sides of said flexible wiring substrate.

7. The seal structure as claimed in claim 1, wherein said projected portions are provided only on one side of said flexible wiring substrate.

8. The seal structure as claimed in claim 1, wherein said projected portions are formed by a base substrate constructing said flexible wiring substrate.

9. The seal structure as claimed in claim 1, wherein said projected portions are formed by a base substrate and a copper foil layer forming a printed wiring layer, which construct said flexible wiring substrate.

10. The seal structure as claimed in claim 1, wherein connectors are attached to end portions of said flexible wiring substrate.

11. The seal structure as claimed in claim 10, wherein widths of positions provided with said connectors are larger than a width of the flexible wiring substrate.

12. The seal structure as claimed in claim 1, wherein said seal members are constructed by a combination of bush shaped members.

13. The seal structure as claimed in claim 1, wherein said seal members are constructed by a combination of a bush shaped member and a frame shaped member.

* * * * *